(12) United States Patent
Fukumoto et al.

(10) Patent No.: US 12,068,439 B2
(45) Date of Patent: Aug. 20, 2024

(54) WAVELENGTH CONVERSION MEMBER, LIGHT-EMITTING ELEMENT, AND LIGHT-EMITTING DEVICE

(71) Applicant: NIPPON ELECTRIC GLASS CO., LTD., Otsu (JP)

(72) Inventors: Shotaro Fukumoto, Otsu (JP); Shunsuke Fujita, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 17/767,130

(22) PCT Filed: Dec. 22, 2020

(86) PCT No.: PCT/JP2020/047850
§ 371 (c)(1),
(2) Date: Apr. 7, 2022

(87) PCT Pub. No.: WO2021/132212
PCT Pub. Date: Jul. 1, 2021

(65) Prior Publication Data
US 2022/0376146 A1    Nov. 24, 2022

(30) Foreign Application Priority Data
Dec. 23, 2019 (JP) ................. 2019-231049

(51) Int. Cl.
*H01L 33/50* (2010.01)
(52) U.S. Cl.
CPC ................. *H01L 33/502* (2013.01)

(58) Field of Classification Search
CPC ... H01L 33/502; H01L 33/505; H01L 33/641; G02B 1/11; G02B 5/20; H01S 5/02; H01S 5/02469
See application file for complete search history.

(56) References Cited

U.S. PATENT DOCUMENTS

| 5,998,925 | A | 12/1999 | Shimizu et al. |
| 6,069,440 | A | 5/2000 | Shimizu et al. |
| 2013/0335989 | A1 | 12/2013 | Sato et al. |

(Continued)

FOREIGN PATENT DOCUMENTS

| JP | 2000-208815 A | 7/2000 |
| JP | 2012-190555 A | 10/2012 |

(Continued)

OTHER PUBLICATIONS

Official Communication issued in International Patent Application No. PCT/JP2020/047850, mailed on Feb. 9, 2021.

(Continued)

*Primary Examiner* — Jonathan Han
(74) *Attorney, Agent, or Firm* — Keating & Bennett, LLP

(57) ABSTRACT

Provided are a wavelength conversion member, a light-emitting element, and a light-emitting device which have high heat dissipation capability and are capable of reducing the decrease in luminescence intensity caused by increased output of an excitation light source. A wavelength conversion member 10 includes a matrix 2 and an inorganic phosphor 1 contained in the matrix 2 and has a relative density of 90% or more, a thermal conductivity of 10 W/m·K or more, and a quantum efficiency of 50% or more.

9 Claims, 2 Drawing Sheets

(56) References Cited

U.S. PATENT DOCUMENTS

| | | | |
|---|---|---|---|
| 2015/0381953 A1* | 12/2015 | Egawa | G02B 26/008 |
| | | | 362/322 |
| 2017/0137706 A1* | 5/2017 | Fujita | H01S 5/02 |
| 2017/0233647 A1 | 8/2017 | Sakawa et al. | |
| 2019/0264100 A1 | 8/2019 | Cozzan et al. | |
| 2020/0347290 A1 | 11/2020 | Nakamura | |
| 2021/0317367 A1* | 10/2021 | Tatami | C04B 41/4578 |

FOREIGN PATENT DOCUMENTS

| | | | |
|---|---|---|---|
| JP | 2012-211229 A | | 11/2012 |
| JP | 2016-204561 A | | 12/2016 |
| JP | 2016-204563 A | | 12/2016 |
| JP | 2016204563 A | * | 12/2016 |
| JP | 2018-180271 A | | 11/2018 |
| WO | 2014/080705 A1 | | 5/2014 |
| WO | 2018/205710 A1 | | 11/2018 |
| WO | 2019/078299 A1 | | 4/2019 |

OTHER PUBLICATIONS

Official Communication issued in corresponding European Patent Application No. 20905069.9, mailed on Dec. 19, 2023.
Cozzan et al., "Stable, Heat-Conducting Phosphor Composites for High-Power Laser Lighting", Applied Materials & Interfaces vol. 10, No. 6, Feb. 5, 2018, pp. 5673-5681.

* cited by examiner

[FIG. 1.]
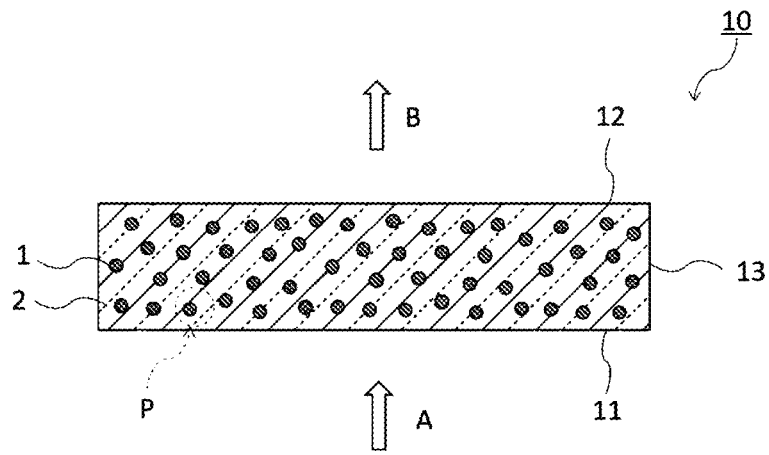
[FIG. 2.]
Portion P
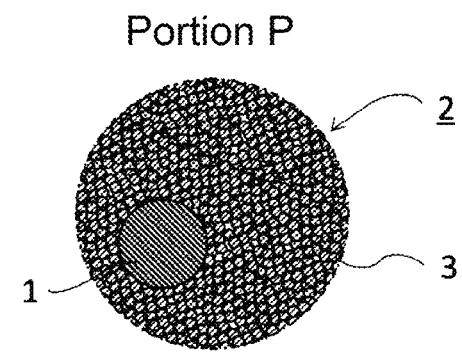
[FIG. 3.]
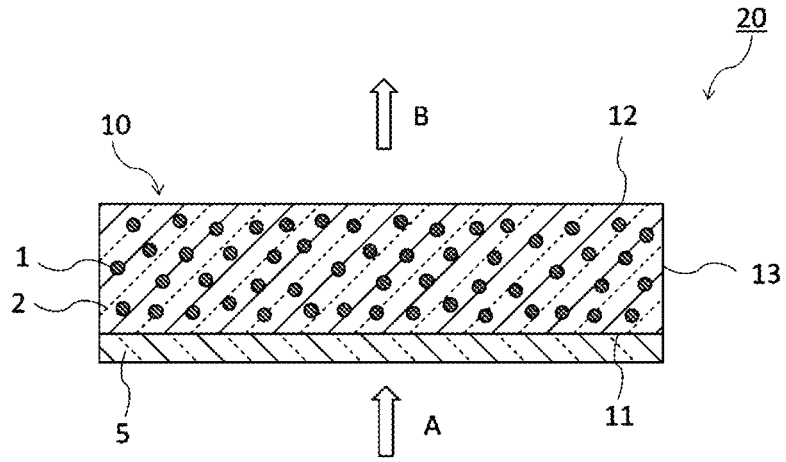

[FIG. 4.]
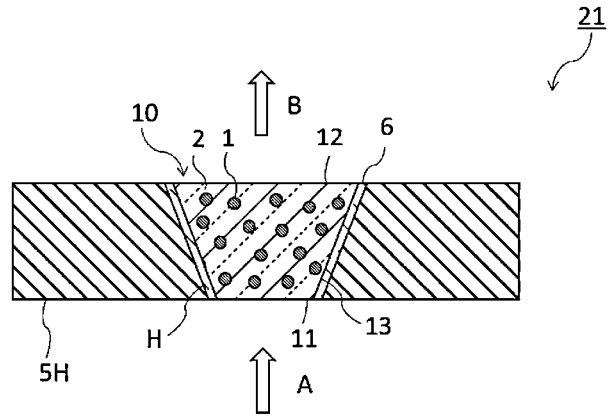
[FIG. 5.]
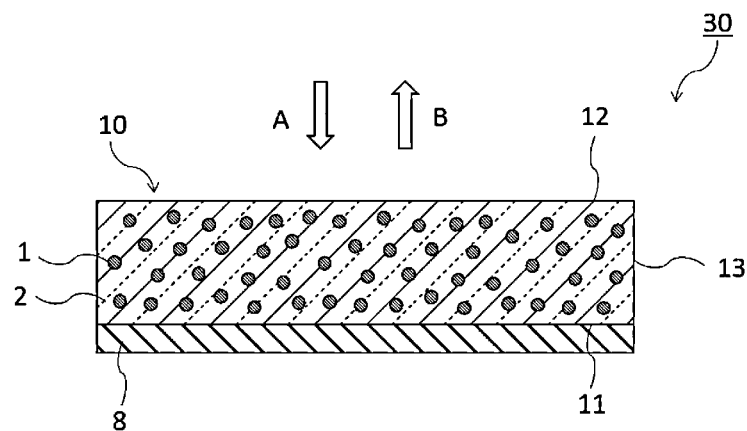
[FIG. 6.]
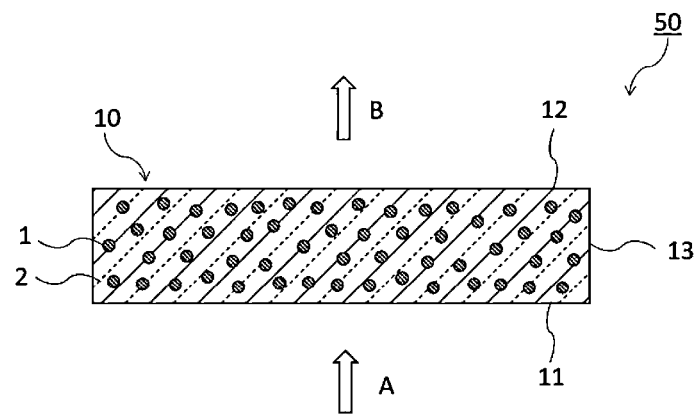
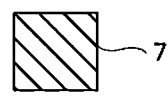

WAVELENGTH CONVERSION MEMBER, LIGHT-EMITTING ELEMENT, AND LIGHT-EMITTING DEVICE

TECHNICAL FIELD

The present invention relates to wavelength conversion members for converting the wavelength of light emitted from light emitting diodes (LEDs), laser diodes (LDs) or the like to another wavelength, light-emitting elements, and light-emitting devices.

BACKGROUND ART

Attention has been focused on light-emitting devices using excitation light sources, such as LEDs, from the viewpoint of their low power consumption, small size, light weight, and easy adjustment to light intensity. For example, there is disclosed a light-emitting device in which a wavelength conversion member is disposed on an LED capable of emitting a blue light and absorbs part of the blue light to convert it to a yellow light (Patent Literature 1). This light-emitting device emits a white light which is a synthetic light of the blue light and the yellow light.

Furthermore, the outputs of excitation light sources have recently advanced for the purpose of increasing the light intensity of light-emitting devices. Accompanied by this, temperature rise of wavelength conversion members is becoming a problem. This temperature rise may decrease the luminescence intensity of the wavelength conversion members (temperature quenching) and may cause deformation, discoloration, and other defects of constituent materials.

As a solution to the above problem, a light-emitting device is disclosed which includes a light-emitting part and a heat dissipating member for dissipating heat produced from the light-emitting part (Patent Literature 2).

CITATION LIST

Patent Literature

[PTL 1]
JP-A-2000-208815
[PTL 2]
WO2014/080705

SUMMARY OF INVENTION

Technical Problem

In the light-emitting device disclosed in Patent Literature 2, the heat dissipating member is joined to the light-emitting part. This structure dissipates heat through the joint surface between the heat dissipating member and the light-emitting part. Therefore, heat dissipation in portions other than the joint surface is likely to be poor. For this reason, it may not be possible to sufficiently reduce the decrease in luminescence intensity caused by increased output of an excitation light source.

In view of the foregoing, the present invention has an object of providing a wavelength conversion member, a light-emitting element, and a light-emitting device which have high heat dissipation capability and are capable of reducing the decrease in luminescence intensity caused by increased output of an excitation light source.

Solution to Problem

A wavelength conversion member according to the present invention is a wavelength conversion member including a matrix and an inorganic phosphor contained in the matrix, and has a relative density of 90% or more, a thermal conductivity of 10 W/m·K or more, and a quantum efficiency of 50% or more.

The wavelength conversion member according to the present invention has a structure in which the relative density is 90% or more and the thermal conductivity of the wavelength conversion member itself is 10 W/m·K or more. In addition, the wavelength conversion member also has a structure in which the quantum efficiency is 50% or more. Since the wavelength conversion member according to the present invention has these structures, it has high heat dissipation capability and can therefore reduce the decrease in luminescence intensity caused by increased output of an excitation light source.

In the wavelength conversion member according to the present invention, the inorganic phosphor is preferably at least one selected from an oxide phosphor, an oxynitride phosphor, and a nitride phosphor.

In the wavelength conversion member according to the present invention, the inorganic phosphor is preferably at least one selected from YAG, LuAG, SiAlON, and CASN.

In the wavelength conversion member according to the present invention, the inorganic phosphor preferably has an average particle diameter of 0.1 to 25 μm.

In the wavelength conversion member according to the present invention, the matrix is preferably made of at least one selected from aluminum oxide, magnesium oxide, zinc oxide, yttrium oxide, aluminum oxynitride, aluminum nitride, and boron nitride.

In the wavelength conversion member according to the present invention, the matrix is preferably made of magnesium oxide.

In the wavelength conversion member according to the present invention, the matrix is preferably made of aluminum nitride.

The wavelength conversion member according to the present invention is preferably formed of a sintered body containing the inorganic phosphor and inorganic particles.

A light-emitting element according to the present invention includes the above-described wavelength conversion member and a substrate disposed on a principal surface of the wavelength conversion member.

A light-emitting device according to the present invention includes the above-described wavelength conversion member and an excitation light source.

In the light-emitting device according to the present invention, the excitation light source is preferably an LD.

Advantageous Effects of Invention

The present invention enables provision of a wavelength conversion member, a light-emitting element, and a light-emitting device which have high heat dissipation capability and are capable of reducing the decrease in luminescence intensity caused by increased output of an excitation light source.

BRIEF DESCRIPTION OF DRAWINGS

FIG. 1 is a schematic cross-sectional view showing a wavelength conversion member according to one embodiment of the present invention.

FIG. 2 is an enlarged view of a portion P of the wavelength conversion member shown in FIG. 1.

FIG. 3 is a schematic cross-sectional view showing a light-emitting element according to a first embodiment of the present invention.

FIG. 4 is a schematic cross-sectional view showing a light-emitting element according to a second embodiment of the present invention.

FIG. 5 is a schematic cross-sectional view showing a light-emitting element according to a third embodiment of the present invention.

FIG. 6 is a schematic cross-sectional view showing a light-emitting device according to one embodiment of the present invention.

DESCRIPTION OF EMBODIMENTS

Hereinafter, a description will be given of preferred embodiments of the present invention. However, the following embodiments are merely illustrative and the present invention is not intended to be limited to the following embodiments. Throughout the drawings, members having substantially the same functions may be referred to by the same reference characters.

(Wavelength Conversion Member 10)

FIG. 1 is a schematic cross-sectional view showing a wavelength conversion member according to an embodiment of the present invention. FIG. 2 is an enlarged view of a portion P of the wavelength conversion member shown in FIG. 1. The wavelength conversion member 10 includes a matrix 2 and an inorganic phosphor 1 contained in the matrix 2. In this embodiment, the inorganic phosphor 1 is dispersed into the matrix 2. Furthermore, as shown in FIG. 2, the wavelength conversion member 10 is formed of a sintered body containing the inorganic phosphor 1 and inorganic particles 3. In other words, the matrix 2 is formed of an aggregate of the inorganic particles 3.

The relative density of the wavelength conversion member 10 is 90% or more, preferably 92% or more, more preferably 95% or more, and particularly preferably 97% or more. Thus, the heat dissipation capability of the wavelength conversion member 10 can be increased and, therefore, the decrease in luminescence intensity caused by increased output of an excitation light source can be easily reduced. In addition, the decrease in luminous efficiency due to temperature quenching of the inorganic phosphor 1 can be easily reduced. If the relative density is too low, a large amount of pores are present in the inside of the wavelength conversion member 10, which makes it likely that the heat dissipation capability decreases. In addition, excitation light A is excessively scattered by the pores, which may decrease the luminescence intensity of the wavelength conversion member 10. In the present invention, the relative density can be calculated by (apparent density)/(true density)×100(%). As the apparent density, the value measured by the Archimedes' method can be used. The true density can be calculated from the equation below using the densities and percentages by volume of the constituent materials (the inorganic phosphor 1 and the inorganic particles 3 in this embodiment) of the wavelength conversion member 10. Also when the wavelength conversion member 10 further contains any constituent material other than the inorganic phosphor 1 and the inorganic particles 3, the relative density can be calculated in the same manner.

True Density={(density of inorganic phosphor 1)×(% by volume of inorganic phosphor 1)+(density of inorganic particles 3)×(% by volume of inorganic particles 3)}/100

The thermal conductivity of the wavelength conversion member 10 is 10 W/m·K or more, preferably 12 W/m·K or more, more preferably 15 W/m·K or more, still more preferably 20 W/m·K or more, yet still more preferably 25 W/m·K or more, and particularly preferably 30 W/m·K or more. Thus, heat produced in the inorganic phosphor 1 can be efficiently released from the entire wavelength conversion member 10 to the outside. The thermal conductivity in the present invention means the value measured at room temperature (approximately 25° C.)

The quantum efficiency of the wavelength conversion member 10 is 50% or more, preferably 60% or more, more preferably 70% or more, still more preferably 80% or more, and particularly preferably 85% or more. The wavelength conversion member 10 satisfying the above values can easily reduce the decrease in luminescence intensity caused by increased output of an excitation light source. In the present invention, the quantum efficiency indicates the value calculated from the equation below and can be measured with an absolute PL quantum yield spectrometer. The above values can be achieved, for example, with the use of an inorganic phosphor 1 having a high quantum efficiency or by producing the wavelength conversion member 10 by a production method to be described later.

Quantum efficiency=[(the number of photons emitted as fluorescence from a sample)/(the number of photons absorbed by the sample)]×100(%)

The product of the thermal conductivity (W/m·K) and the quantum efficiency (%) of the wavelength conversion member 10 is preferably 500 or more, more preferably 1000 or more, still more preferably 1500 or more, yet still more preferably 1800 or more, even more preferably 2000 or more, and particularly preferably 2200 or more. The wavelength conversion member 10 satisfying the above values has high heat dissipation capability and can therefore easily reduce the decrease in luminescence intensity caused by increased output of an excitation light source.

The porosity of the wavelength conversion member 10 is preferably 10% or less, more preferably 8% or less, still more preferably 5% or less, yet still more preferably 3% or less, and particularly preferably 2% or less. The average pore diameter of the pores is preferably 1 μm or less, more preferably 800 nm or less, still more preferably 500 nm or less, and particularly preferably 300 nm or less. Thus, the heat dissipation capability of the wavelength conversion member 10 can be easily increased. In the present invention, the porosity can be measured by mercury intrusion porosimetry or nitrogen adsorption and desorption method. Specifically, the porosity means the value obtained by dividing the amount of adsorbed sample measured by the above method by the volume of the sample and then multiplying the quotient by 100. The average pore diameter means a pore diameter corresponding to a maximum peak value in a pore diameter distribution measured by mercury intrusion porosimetry or nitrogen adsorption and desorption method. If measurement data cannot be obtained by mercury intrusion porosimetry or nitrogen adsorption and desorption method, pores may be closed and isolated. In this case, the average pore diameter can be identified by observing cross sections of the wavelength conversion member 10 with an electron microscope. A specific example is the following method. First, the wavelength conversion member 10 undergoes image acquisition by SEM observation (magnification: 1000-fold), thus obtaining a plurality of (for example, 2 to 10) sectional images of the wavelength conversion member 10. Next, each of the plurality of obtained sectional images is subjected to image processing to determine a void size distribution and an area ratio for each image. In doing so, a pore diameter corresponding to a peak value in the void size distribution is defined as the average pore diameter and the area ratio is defined as the porosity. Finally, the respective averages of the average pore diameters and porosities obtained for individual images are taken.

The shape of the wavelength conversion member 10 is not particularly limited and may be, for example, a rectangular shape, an approximately disc-like shape, a spherical shape, a semispherical shape or a semispherical domed shape.

An antireflection film or a bandpass filter may be provided on a first principal surface 11 and/or a second principal surface 12 of the wavelength conversion member 10. Thus, the amount of fluorescence trapped in the inside of the wavelength conversion member 10 can be reduced to reduce heat production due to fluorescence reabsorption of the inorganic phosphor 1, which makes it easy to reduce the decrease in luminescence intensity. A reflective layer may be provided on a side surface 13 of the wavelength conversion member 10. Thus, leakage of excitation light A and fluorescence through the side surface 13 to the outside can be easily prevented. Therefore, the intensity of excitation light A necessary for achieving a desired luminescence intensity can be lowered, which makes it easier to reduce the decrease in luminescence intensity.

The wavelength conversion member 10 according to the present invention may be used as both a so-called transmissive type and a so-called reflective type. In the case of a transmissive type, as shown in FIG. 1, excitation light A enters the wavelength conversion member 10 through the first principal surface 11. Part of the incident excitation light A is converted in wavelength to fluorescence having a wavelength different from the excitation light A by the inorganic phosphor 1. Then, a synthetic light B of the excitation light A and the fluorescence exits the wavelength conversion member 10 through the second principal surface 12. The so-called reflective type will be described later.

(Inorganic Phosphor 1)

The inorganic phosphor 1 is preferably an phosphor having an excitation band between 300 nm and 500 nm and an emission peak between 380 nm and 780 nm. Examples that can be used include oxide phosphors, nitride phosphors, oxynitride phosphors, chloride phosphors, oxychloride phosphors, halide phosphors, aluminate phosphors, and halophosphoric acid chloride phosphors. Particularly, at least one selected from oxide phosphors, oxynitride phosphors, and nitride phosphors is preferred. Specifically, the inorganic phosphor 1 is preferably at least one selected from YAG (yttrium-aluminum-garnet), LuAG (lutetium-aluminum-garnet), SiAlON, and CASN ($CaAlSiN_3$). Because of a small decrease in quantum efficiency due to temperature rise, at least one selected from YAG (yttrium-aluminum-garnet) and LuAG (lutetium-aluminum-garnet) is more preferred. Alternatively, a plurality of types of inorganic phosphors 1 may be used in mixture according to the chromaticity of excitation light A or a desired synthetic light B.

The quantum efficiency of the inorganic phosphor 1 at an emission peak wavelength is preferably 60% or more, more preferably 70% or more, still more preferably 80% or more, and particularly preferably 90% or more. Thus, the quantum efficiency of the wavelength conversion member 10 can be easily increased.

When the wavelength conversion member 10 is used as a so-called transmissive type, the content of the inorganic phosphor 1 is, in terms of % by volume, preferably 0.1 to 80%, more preferably 1 to 50%, still more preferably 2 to 30%, yet still more preferably 3 to 20%, and particularly preferably 5 to 15%. On the other hand, when the wavelength conversion member 10 is used as a so-called reflective type, the content of the inorganic phosphor 1 is, in terms of % by volume, preferably 10 to 80%, more preferably 30 to 80%, still more preferably 55 to 80%, and particularly preferably 65 to 80%. If the content of the inorganic phosphor 1 is too large, the thermal conductivity of the wavelength conversion member 10 is likely to decrease. In addition, the inorganic phosphor 1 reabsorbs fluorescence to reduce the amount of transmitted excitation light A, which makes it difficult to control the chromaticity of the synthetic light B. On the other hand, if the content of the inorganic phosphor 1 is too small, a desired luminescence intensity is difficult to achieve.

The average particle diameter ($D_{50}$) of the inorganic phosphor 1 is preferably 0.1 to 25 μm, more preferably 1 to 20 μm, and particularly preferably 2 to 15 μm. If the average particle diameter ($D_{50}$) is too large, the luminescent color of the wavelength conversion member 10 is likely to be uneven. On the other hand, if the average particle diameter ($D_{50}$) is too small, the inorganic phosphor 1 is likely to agglomerate during production, which makes it likely that the luminescent color of the wavelength conversion member 10 is uneven.

(Matrix 2)

The matrix 2 is preferably made of an inorganic material having a higher thermal conductivity than the inorganic phosphor 1. Specifically, the matrix 2 is preferably made of at least one selected from aluminum oxide, magnesium oxide, zinc oxide, yttrium oxide, aluminum oxynitride, aluminum nitride, and boron nitride, and particularly preferably magnesium oxide or aluminum nitride. Thus, the heat dissipation capability of the wavelength conversion member 10 can be easily increased and, therefore, the decrease in luminescence intensity caused by increased output of the excitation light source can be easily reduced. Particularly, magnesium oxide is preferred because it absorbs less light in a visible wavelength range (400 to 780 nm) and thus can more easily reduce the decrease in luminescence intensity. These materials may be used singly or in mixture. Alternatively, a solid solution (for example, a magnesium oxide-aluminum oxide solid solution) in which these materials are distributed in a desired ratio may be used.

The thermal conductivity of the matrix 2 is preferably 10 $W \cdot m^{-1} K^{-1}$ or more, more preferably 15 $W \cdot m^{-1} K^{-1}$ or more, still more preferably 20 $W \cdot m^{-1} K^{-1}$ or more, yet still more preferably 25 $W \cdot m^{-1} K^{-1}$ or more, even more preferably 30 $W \cdot m^{-1} K^{-1}$ or more, even still more preferably 35 $W \cdot m^{-1} K^{-1}$ or more, even yet still more preferably 40 $W \cdot m^{-1} K^{-1}$ or more, and particularly preferably 45 $W \cdot m^{-1} K^{-1}$ or more. Thus, the heat dissipation capability of the wavelength conversion member 10 can be increased and, therefore, the decrease in luminescence intensity caused by increased output of an excitation light source can be easily reduced.

In this embodiment, the matrix 2 is formed of an aggregate of inorganic particles 3. The inorganic particles 3 mean particles obtained by firing powder of the above inorganic material (inorganic material powder). The average primary particle diameter ($D_{50}$ of the inorganic particles 3 is preferably 2 μm or less, more preferably 1 μm or less, still more preferably 500 nm or less, yet still more preferably 300 nm or less, even more preferably 100 nm or less, even still more preferably 80 nm or less, and particularly preferably 50 nm or less. Thus, the heat dissipation capability of the wavelength conversion member 10 can be easily increased. The average particle diameter ($D_{50}$ of the inorganic particles 3 can be identified by observing cross sections of the wavelength conversion member 10 using electron micrographs.

The ratio of the average particle diameter ($D_{50}$) (μm) of the inorganic phosphor 1 to the average particle diameter ($D_{50}$) (μm) of the inorganic particles 3, (average particle diameter of inorganic phosphor 1)/(average particle diameter of inorganic particles 3), is preferably 1 or more, more preferably 5 or more, still more preferably 10 or more, yet still more preferably 100 or more, even more preferably 200 or more, even still more preferably 300 or more, even yet still more preferably 400 or more, and particularly preferably 420 or more. The ratio of the average particle diameter ($D_{50}$) (μm) of the inorganic phosphor 1 to the average particle diameter ($D_{50}$) (μm) of the inorganic material powder, (average particle diameter of inorganic phosphor 1)/(average particle diameter of inorganic material powder), is preferably 1 or more, more preferably 5 or more, still more preferably 10 or more, yet still more preferably 100 or more, even more preferably 200 or more, even still more preferably 300 or more, even yet still more preferably 400 or more, and particularly preferably 450 or more. Thus, a dense wavelength conversion member 10 can be easily formed by firing and, thus, the heat dissipation capability can be easily increased.

As will be described later, the wavelength conversion member 10 is produced by firing a mixture of the inorganic phosphor 1 and the inorganic material powder. In doing so, the inorganic material powder is preferably reduced in the occurrence of grain growth and agglomeration due to the firing. The grain growth and agglomeration mean a state where the average particle diameter of the inorganic particle 3 becomes greater than the average particle diameter of the inorganic material powder. If grain growth and agglomeration occur, voids are likely to be produced in the wavelength conversion member 10. In the present invention, the rate of the inorganic material powder having an average primary particle diameter exceeding 1 μm after the firing is, in terms of area percentage, preferably 50% or less, more preferably 20% or less, still more preferably 10% or less, yet still more preferably 5% or less, even more preferably 3% or less, and particularly preferably 1% or less. Thus, a dense wavelength conversion member 10 can be easily formed by firing and, thus, the heat dissipation capability can be easily increased. The grain growth and agglomeration of the inorganic material powder can be identified by observing cross sections of the wavelength conversion member 10 using electron micrographs to measure the average particle diameter of the inorganic particles 3 and comparing the average particle diameter of the inorganic particle 3 with the average particle diameter of the inorganic material powder.

The average particle diameter ($D_{50}$) of the inorganic material powder is preferably 1 μm or less, more preferably 500 nm or less, still more preferably 300 nm or less, yet still more preferably 100 nm or less, even more preferably 80 nm or less, and particularly preferably 50 nm or less. Thus, a dense wavelength conversion member 10 can be easily formed by firing and, thus, the heat dissipation capability can be easily increased. In addition, the inorganic phosphor 1 can be easily uniformly dispersed, which makes it easy to achieve an even luminescent color of the wavelength conversion member 10. The lower limit of the average particle diameter is not particularly limited, but is actually not less than 1 nm.

(Production Method of Wavelength Conversion Member 10)

The wavelength conversion member 10 according to the present invention is preferably produced by firing a mixture of the inorganic material powder and the inorganic phosphor 1. By this production method, a wavelength conversion member 10 formed of a sintered body containing the inorganic phosphor 1 and the inorganic particles 3 can be obtained.

The firing is preferably performed by hot pressing. Thus, a dense wavelength conversion member 10 can be easily formed by firing and, thus, the thermal conductivity can be easily increased. The press surface pressure can be appropriately adjusted depending on a desired thickness of the wavelength conversion member 10. For example, the press surface pressure is preferably 1 MPa or more, more preferably 10 MPa or more, still more preferably 30 MPa or more, yet still more preferably 50 MPa or more, and particularly preferably 80 MPa or more. The upper limit of the press surface pressure is not particularly limited, but, for the purpose of preventing breakage of the press mold, it is, for example, preferably not more than 120 MPa and particularly preferably not more than 100 MPa.

The maximum temperature during firing is preferably 1900° C. or lower, more preferably 1800° C. or lower, still more preferably 1700° C. or lower, yet still more preferably 1600° C. or lower, even more preferably 1500° C. or lower, even still more preferably 1400° C. or lower, and particularly preferably 1300° C. or lower. Particularly, in performing firing in a vacuum atmosphere, the maximum temperature is preferably lower than 1500° C. and more preferably 1450° C. or lower. If the maximum temperature during firing is too high, the inorganic phosphor 1 is likely to be degraded by heat. In addition, grain growth of the inorganic material powder is likely to progress. On the other hand, if the maximum temperature during firing is too low, a dense wavelength conversion member 10 is difficult to form by firing. Therefore, the maximum temperature during firing is preferably not lower than 600° C., more preferably not lower than 700° C., and particularly preferably not lower than 800° C.

The press holding time is preferably 0.1 to 20 hours, more preferably 0.5 to 15 hours, and particularly preferably 1 to 10 hours. If the press holding time is too long, the production efficiency is likely to decrease. On the other hand, if the press holding time is too long, a dense wavelength conversion member 10 is difficult to form by firing.

The atmosphere during firing is preferably an inert atmosphere, a reductive atmosphere or a vacuum atmosphere. Thus, the deterioration of the inorganic phosphor 1 can be easily reduced. In addition, the deterioration of the press mold can be easily reduced. In an inert atmosphere, nitrogen or argon gas is preferably used as an inert gas. From the viewpoint of running cost, nitrogen gas is preferably used. In a reductive atmosphere, hydrogen gas is preferably used as a reductive gas. From the viewpoint of safety, a mixed gas of hydrogen gas and an inert gas is preferably used.

When the matrix 2 is made of a nitride, the atmosphere during firing is preferably a nitrogen atmosphere. Thus, the coloration of the matrix 2 can be reduced and, thus, the decrease in luminescence intensity of the wavelength conversion member 10 can be more easily reduced. If the matrix 2 is colored, it is likely to produce heat upon irradiation with excitation light A.

The method for producing the wavelength conversion member 10 is not limited to hot pressing. For example, a sintered body may be produced by applying pressure to a mixture of the inorganic material powder and the inorganic phosphor 1 with a mold and firing the obtained preform.

Alternatively, a sintered body may be produced by packing the preform in a rubber mold and consolidating it by hot isostatic pressing.

(Light-Emitting Element 20, 21, 30)

FIG. 3 is a schematic cross-sectional view showing a light-emitting element according to a first embodiment of the present invention. As shown in FIG. 3, a light-emitting element 20 in this embodiment includes a wavelength conversion member 10 and a substrate 5. In this embodiment, the wavelength conversion member 10 is used as a so-called transmissive type. In this embodiment, the substrate 5 is formed on the first principal surface 11 of the wavelength conversion member 10.

The light-emitting element 20 according to the present invention has high heat dissipation capability because the wavelength conversion member 10 itself has a high thermal conductivity, and, therefore, the decrease in luminescence intensity caused by increased output of an excitation light source can be reduced. In addition, because heat produced by the irradiation of the wavelength conversion member 10 with excitation light A is released through the substrate 5 to the outside, the decrease in luminescence intensity caused by increased output of the excitation light source can be further reduced.

The substrate 5 preferably has a higher thermal conductivity than the wavelength conversion member 10. Specifically, the thermal conductivity of the substrate 5 is preferably 10 W/m·K or more, more preferably 12 W/m·K or more, still more preferably 15 W/m·K or more, yet still more preferably 20 W/m·K or more, even more preferably 25 W/m·K or more, and particularly preferably 30 W/m·K or more. Thus, the decrease in luminescence intensity caused by increased output of the excitation light source can be further reduced.

In this embodiment, the wavelength conversion member 10 is used as a so-called transmissive type. Therefore, in this embodiment, the substrate 5 is preferably a light-transmissive substrate capable of transmitting excitation light A. Specifically, the total light transmittance of the substrate 5 for wavelengths of 400 to 800 nm is preferably 10% or more, more preferably 20% or more, still more preferably 30% or more, and particularly preferably 40% or more.

For example, a light-transmissive ceramic substrate made of aluminum oxide, zirconium oxide, aluminum nitride, silicon carbide, boron nitride, magnesium oxide, titanium oxide, niobium oxide, zinc oxide or yttrium oxide is preferably used as the substrate 5.

The thickness of the substrate 5 is preferably 0.05 to 1 mm, more preferably 0.07 to 0.8 mm, and particularly preferably 0.1 to 0.5 mm. If the thickness of the substrate 5 is too small, the effect of increasing the thermally conductive properties given by the substrate 5 is difficult to achieve. On the other hand, if the thickness of the substrate 5 is too large, the light-emitting element 20 is likely to grow in size.

Although in this embodiment the substrate 5 is formed on the first principal surface 11 of the wavelength conversion member 10, the location where the substrate 5 is formed is not limited to this. For example, the substrate 5 may be formed on the second principal surface 12 of the wavelength conversion member 10. Alternatively, substrates 5 may be formed on both the first principal surface 11 and the second principal surface 12 of the wavelength conversion member 10. In the case where the substrates 5 are provided on both the surfaces, the substrates 5 may have the same thickness or different thicknesses. For example, the thickness of one of the substrates 5 may be relatively large (for example, 0.2 mm or more and preferably 0.5 mm or more) and the thickness of the other substrate 5 may be relatively small (for example, less than 0.2 mm and preferably 0.1 mm or less).

An antireflection film or a bandpass filter may be provided on a principal surface of the substrate 5 through which excitation light A enters the substrate 5. Furthermore, an antireflection film may be provided on the side of the substrate 5 through which the excitation light A and fluorescence exit the substrate 5. As a result of these structures, the decrease in luminescence intensity can be easily reduced. In addition, a reflective layer may be provided on the side surface 13 of the wavelength conversion member 10 and the side surface of the substrate 5. Thus, leakage of excitation light A and fluorescence through the side surface 13 and the side surface of the substrate 5 to the outside can be easily prevented. Therefore, the luminescence intensity can be increased.

FIG. 4 is a schematic cross-sectional view showing a light-emitting element according to a second embodiment of the present invention. As shown in FIG. 4, a light-emitting element 21 in this embodiment includes a wavelength conversion member 10 and a substrate 5H with a through hole H. In this embodiment, the wavelength conversion member 10 is used as a so-called transmissive type. In this embodiment, the wavelength conversion member 10 is fixed in the through hole H of the substrate 5H.

In this embodiment, the wavelength conversion member 10 is preferably fixed through an adhesive layer 6 to the substrate 5H. The adhesive layer 6 is made of, for example, bonding glass. The bonding glass is, for example, preferably at least one selected from silicate glass, borosilicate glass, tin-phosphate glass, bismuthate glass, and lead borosilicate glass. Among them, borosilicate-based glasses and tin-phosphate-based glasses are particularly preferred because they have relatively low softening points to enable low-temperature sintering and can reduce degradation of the inorganic phosphor 1 during firing.

As for the bonding glass, for example, the total light transmittance for wavelengths of 400 to 800 nm measured at a thickness of 1 mm is preferably 10% or more, more preferably 20% or more, still more preferably 30% or more, and particularly preferably 40% or more.

The adhesive layer 6 preferably contains inorganic material powder. Thus, the heat dissipation of the wavelength conversion member 10 to the substrate 5H can be increased. In addition, because the adhesive layer 6 acts as a reflective layer at the interface between the wavelength conversion member 10 and the substrate 5H, the intensity of the synthetic light B can be easily increased.

The shape of the through hole H is not particularly limited and may be, for example, a cylindrical shape, a conical shape, a polygonal prismatic shape or a polygonal pyramidal shape. When the through hole H has a conical shape or a polygonal pyramidal shape, the surface area of the light exit surface (i.e., the second principal surface 12 of the wavelength conversion member 10) is preferably larger than the surface area of the surface on which excitation light A is incident (i.e., the first principal surface 11 of the wavelength conversion member 10). By doing so, the intensity of the synthetic light B can be increased.

FIG. 5 is a schematic cross-sectional view showing a light-emitting element according to a third embodiment of the present invention. As shown in FIG. 5, a light-emitting element 30 in this embodiment includes a wavelength conversion member 10 and a reflective substrate 8. In other words, in this embodiment, the wavelength conversion member 10 is used as a so-called reflective type. In this case, as shown in FIG. 5, excitation light A enters the wavelength conversion member 10 through the second principal surface 12. Part of the incident excitation light A is converted in wavelength to fluorescence having a wavelength different from the excitation light A by the inorganic phosphor 1. Then, a synthetic light B of the excitation light A and the fluorescence is reflected by the reflective substrate 8 and exits the wavelength conversion member 10 through the second principal surface 12.

The material for the reflective substrate 5 is not particularly limited and any material, including metals and ceramics, capable of reflecting the synthetic light B of the excitation light A and the fluorescence can be suitably used. The metal used is preferably at least one selected from copper, aluminum, iron, and silver. The ceramic used is preferably at least one selected from aluminum oxide, magnesium oxide, zinc oxide, aluminum nitride, and boron nitride. Alternatively, porous ceramic may be used as the ceramic.

The thermal conductivity of the reflective substrate 8 is preferably 10 W/m·K or more, more preferably 12 W/m·K or more, still more preferably 15 W/m·K or more, yet still more preferably 20 W/m·K or more, even more preferably 25 W/m·K or more, and particularly preferably 30 W/m·K or more. Thus, the decrease in luminescence intensity caused by increased output of the excitation light source can be further reduced.

The thickness of the reflective substrate 8 is preferably 2 mm or less, more preferably 1.5 mm or less, and particularly preferably 1 mm or less. If the thickness of the reflective substrate 8 is too large, the light-emitting element 21 is likely to grow in size. The lower limit of the thickness of the reflective substrate 8 is preferably not less than 0.01 mm, more preferably not less than 0.05 mm, still more preferably not less than 0.1 mm, yet still more preferably not less than 0.2 mm, and even more preferably not less than 0.5 mm. If the thickness of the reflective substrate 8 is too small, reflection becomes insufficient, so that the excitation light A and the fluorescence may pass through the reflective substrate 8. This may decrease the intensity of the synthetic light B exiting the wavelength conversion member through the second principal surface 12.

(Light-Emitting Device 50)

FIG. 6 is a schematic cross-sectional view showing a light-emitting device according to an embodiment of the present invention. As shown in FIG. 6, a light-emitting device 50 in this embodiment includes a wavelength conversion member 10 and an excitation light source 7. In this embodiment, the wavelength conversion member 10 is used as a so-called transmissive wavelength conversion member. The excitation light source 7 is disposed so that excitation light A enters the wavelength conversion member 10 through the first principal surface 11. Excitation light A emitted from the excitation light source 7 is converted in wavelength to fluorescence having a longer wavelength than the excitation light A by the wavelength conversion member 10. Furthermore, part of the excitation light A passes through the wavelength conversion member 10. Therefore, the wavelength conversion member 10 emits a synthetic light B composed of the excitation light A and the fluorescence. For example, when the excitation light A is a blue light and the fluorescence is a yellow light, a white synthetic light B can be provided.

Alternatively, in the light-emitting device 50, the light-emitting element 20 shown in FIG. 3 or 4 may be used instead of the wavelength conversion member 10. Still alternatively, a so-called reflective wavelength conversion member (i.e., the light-emitting element 30 shown in FIG. 5) may be used. In this case, the excitation light source 7 is disposed so that excitation light A enters the wavelength conversion member 10 through the second principal surface 12.

The excitation light source 7 is preferably an LED or an LD. From the viewpoint of increasing the luminescence intensity of the light-emitting device 50, an LD, which is capable of emitting high-intensity light, is particularly preferably used. In the light-emitting device 50 in which an LD is used, high-intensity excitation light A is applied within a narrow irradiation range. Therefore, the luminescence intensity can be easily increased, but a local temperature rise of the wavelength conversion member 10 is likely to occur. As described previously, since the wavelength conversion member 10 used in the light-emitting device 50 according to the present invention has a high thermal conductivity by itself, the light-emitting device 50 has high heat dissipation capability and, therefore, the decrease in luminescence intensity caused by increased output of the excitation light source 7 can be reduced.

EXAMPLES

Hereinafter, the present invention will be described with reference to examples, but the present invention is not limited to the following examples.

Tables 1 and 2 show working examples (Nos. 4 to 10, 12 to 17, and 19) of the present invention and comparative examples (Nos. 1 to 3, 11, and 18).

TABLE 1

| | | No. 1 | No. 2 | No. 3 | No. 4 | No. 5 | No. 6 | No. 7 | No. 8 | No. 9 |
|---|---|---|---|---|---|---|---|---|---|---|
| Inorganic Matrix | Type | MgO | MgO | MgO | MgO | MgO | MgO | MgO | MgO | MgO |
| | Density (g/m$^3$) | 3.6 | 3.6 | 3.6 | 3.6 | 3.6 | 3.6 | 3.6 | 3.6 | 3.6 |
| | Volume (%) | 90 | 90 | 90 | 90 | 90 | 90 | 90 | 90 | 90 |
| Inorganic Phosphor | Type | YAG | YAG | YAG | YAG | YAG | YAG | YAG | YAG | YAG |
| | Density (g/m$^3$) | 4.7 | 4.7 | 4.7 | 4.7 | 4.7 | 4.7 | 4.7 | 4.7 | 4.7 |
| | Volume (%) | 10 | 10 | 10 | 10 | 10 | 10 | 10 | 10 | 10 |
| Firing Temperature (° C.) | | 1000 | 1200 | 1000 | 1100 | 1100 | 1200 | 1200 | 1200 | 1300 |
| Maximum Temperature Holding Time (h) | | 0 | 0 | 1 | 1 | 5 | 1 | 3 | 5 | 1 |
| Firing Atmosphere | | vacuum | vacuum | vacuum | vacuum | vacuum | vacuum | vacuum | vacuum | vacuum |
| Pressure during Pressing (MPa) | | 40 | 40 | 40 | 40 | 40 | 40 | 40 | 40 | 40 |
| Wavelength Conversion Member | Relative density (%) | 72.7 | 87.5 | 82.8 | 95.7 | 97.6 | 96.0 | 98.6 | 99.1 | 99.3 |
| | Thermal conductivity (W/(m · K)) | 4.3 | 8.7 | 7.5 | 10.9 | 14.6 | 22.7 | 24.5 | 26.5 | 24.6 |
| | Quantum efficiency (%) | 90.1 | 85.3 | 82.5 | 81.2 | 79.7 | 73.2 | 68.2 | 65.2 | 54.0 |
| Excitation Light Intensity at 95% Reference Conversion Efficiency (W) | | 1.74 | 2.42 | 2.15 | 2.66 | 3.23 | 4.11 | 4.16 | 4.28 | 3.56 |

TABLE 2

|  |  | No. 10 | No. 11 | No. 12 | No. 13 | No. 14 | No. 15 | No. 16 | No. 17 | No. 18 | No. 19 |
|---|---|---|---|---|---|---|---|---|---|---|---|
| Inorganic Matrix | Type | MgO | MgO | MgO | MgO | MgO | MgO | MgO | MgO | Glass A | AlN |
|  | Density (g/m$^3$) | 3.6 | 36 | 3.6 | 3.6 | 3.6 | 3.6 | 3.6 | 3.6 | 3.1 | 3.3 |
|  | Volume (%) | 90 | 90 | 90 | 90 | 90 | 90 | 90 | 90 | 90 | 90 |
| Inorganic Phosphor | Type | YAG | YAG | YAG | YAG | YAG | YAG | YAG | YAG | YAG | YAG |
|  | Density (g/m$^3$) | 4.7 | 4.7 | 4.7 | 4.7 | 4.7 | 4.7 | 4.7 | 4.7 | 4.7 | 4.7 |
|  | Volume (%) | 10 | 10 | 10 | 10 | 10 | 10 | 10 | 10 | 10 | 10 |
| Firing Temperature (° C.) |  | 1400 | 1500 | 1200 | 1000 | 1000 | 1000 | 1000 | 950 | 900 | 1800 |
| Maximum Temperature Holding Time (h) |  | 1 | 1 | 1 | 1 | 5 | 8 | 10 | 10 | 10 | 1 |
| Firing Atmosphere |  | vacuum | vacuum | vacuum | vacuum | vacuum | vacuum | vacuum | vacuum | vacuum | nitrogen |
| Pressure during Pressing (MPa) |  | 40 | 40 | 80 | 80 | 80 | 80 | 80 | 80 | — | — |
| Wavelength Conversion Member | Relative density (%) | 99.5 | 99.8 | 99.2 | 94.0 | 96.7 | 98.2 | 98.9 | 95.6 | 100.0 | 97.6 |
|  | Thermal conductivity (W/(m · K)) | 26.2 | 21.5 | 27.7 | 19.5 | 24.7 | 25.2 | 30.4 | 20.5 | 0.9 | 73.0 |
|  | Quantum efficiency (%) | 50.7 | 36.0 | 79.6 | 87.6 | 87.5 | 85.0 | 86.3 | 87.0 | 87.0 | 50.3 |
| Excitation Light Intensity at 95% Reference Conversion Efficiency (W) |  | 3.53 | 2.48 | 5.16 | 4.25 | 5.07 | 5.04 | 6.04 | 4.32 | 0.87 | 8.13 |

The working examples and comparative examples were produced in the following manner. First, an inorganic phosphor and inorganic material powder were mixed to give their contents shown in Tables 1 and 2, thus obtaining a mixture. The materials used were as follows.
(a) Inorganic Phosphor
YAG phosphor ($Y_3Al_5O_{12}$, average particle diameter: 24 µm)
(b) Inorganic Material Powder
MgO particles (thermal conductivity: approximately 45 W/m·K, average particle diameter: 0.05 µm, refractive index (nd): 1.74)
Glass A ($SiO_2$—$B_2O_3$-based glass, thermal conductivity: approximately 0.8 W/m·K, average particle diameter: 3 µm, refractive index (nd): 1.58)
AlN particles (thermal conductivity: approximately 180 W/m·K, average particle diameter: 0.6 µm, refractive index (nd): 2.2)
The above-described obtained mixture was put into a mold, fired therein under the conditions described in Tables 1 and 2, and then gradually cooled to ordinary temperature. Thus, a wavelength conversion member formed of a sintered body of the mixture was produced.

Each of the obtained wavelength conversion members was evaluated in terms of density of fired body, relative density, thermal conductivity, quantum efficiency, and excitation light intensity at which the conversion efficiency reaches 95% of a reference conversion efficiency. The results are shown in Tables 1 and 2.

The relative density was calculated by (apparent density)/(true density)×100(%). The density of the fired body was adopted as the apparent density. The density of the fired body was measured by the Archimedes' method. The true density was the value obtained by multiplying the density and % by volume of each of the constituent materials (the inorganic phosphor and the inorganic particles), adding the obtained values together, and then dividing the sum by 100. Specifically, the true density was calculated from the following equation.

True Density={(density of inorganic phosphor)×(% by volume of inorganic phosphor)+(density of inorganic particles)×(% by volume of inorganic particles)}/100

The thermal conductivity was calculated from the equation below. The thermal diffusivity was measured as a value at 25° C. with a laser flash apparatus (manufactured by NETZSCH) by the flash method. The specific heat was measured as a value at 25° C. with a differential scanning calorimeter (manufactured by Rigaku Corporation).

Thermal Conductivity=(density of fired body)×(thermal diffusivity)×(specific heat)

The quantum efficiency was calculated using an absolute PL quantum yield spectrometer (manufactured by Hamamatsu Photonics K.K.) and the following equation.

Quantum efficiency=[(the number of photons emitted as fluorescence from a sample)/(the number of photons absorbed by the sample)]×100(%)

Each of the obtained wavelength conversion members was irradiated with excitation light with increasing output of the excitation light source and measured in terms of the output of the excitation light source at which the conversion efficiency decreased to 95% of a reference conversion efficiency. The reference conversion efficiency was defined as a conversion efficiency at which the output of the excitation light source was 0.1 W. Specifically, the output of the excitation light source was measured in the following manner. First, each of the produced wavelength conversion members was processed to a size of 5 mm×5 mm×0.2 mm and the surface was mirror polished, thus obtaining a measurement sample. Next, the measurement sample was sandwiched between two alumite plates with a 1 mm diameter through hole and mechanically fastened together with the plates. One of the principal surfaces of the measurement sample was oriented to a blue LED light source (with a central wavelength of 450 nm), while the other principal surface was oriented to an integrating sphere. Next, the one surface of the measurement sample was irradiated with excitation light from the blue LED light source. Light having passed through the measurement sample was collected and measured in terms of luminous flux with a spectrometer (manufactured by Hamamatsu Photonics K.K.). The conversion efficiency was calculated using the following equation.

Conversion Efficiency=(luminous flux (lm))/(output (w) of excitation light source)×100

The samples Nos. 4 to 10, 12 to 17, and 19 of the working examples exhibited relative densities exceeding 90%, thermal conductivities exceeding 10 W/m·K, and quantum efficiencies exceeding 50%. Furthermore, the outputs of the excitation light source at which the conversion efficiency reached 95% of the reference conversion efficiency were as high as 2.66 W or more. In contrast, as for the samples Nos. 1 to 3, 10, and 18 of the comparative examples, the outputs of the excitation light source at which the conversion efficiency reached 95% of the reference conversion efficiency were as low as 2.48 W or less.

REFERENCE SIGNS LIST 1 inorganic phosphor
2 matrix
3 inorganic particle
5, 5H substrate
6 adhesive layer
8 reflective substrate
7 excitation light source
10 wavelength conversion member
11 first principal surface
12 second principal surface
13 side surface
20, 21, 30 light-emitting element
50 light-emitting device
A excitation light
B synthetic light

The invention claimed is:

1. A wavelength conversion member comprising:
a matrix and an inorganic phosphor contained in the matrix, the wavelength conversion member having a relative density of 98.2% or more and 99.5% or less, a thermal conductivity of 10 W/m·K or more, and a quantum efficiency of 50% or more, wherein
the matrix is made of inorganic particles consisting of magnesium oxide.

2. The wavelength conversion member according to claim 1, wherein the inorganic phosphor is at least one selected from an oxide phosphor, an oxynitride phosphor, and a nitride phosphor.

3. The wavelength conversion member according to claim 1, wherein the inorganic phosphor is at least one selected from YAG, LuAG, SiAlON, and CASN.

4. The wavelength conversion member according to claim 1, wherein the inorganic phosphor has an average particle diameter of 0.1 to 25 μm.

5. The wavelength conversion member according to claim 1, wherein the matrix is made of at least one selected from aluminum oxide, magnesium oxide, zinc oxide, yttrium oxide, aluminum oxynitride, aluminum nitride, and boron nitride.

6. The wavelength conversion member according to claim 1, being formed of a sintered body of a mixture containing the inorganic phosphor and the inorganic particles.

7. A light-emitting element comprising:
the wavelength conversion member according to claim 1; and
a substrate disposed on a principal surface of the wavelength conversion member.

8. A light-emitting device comprising:
the wavelength conversion member according to claim 1; and
an excitation light source.

9. The light-emitting device according to claim 8, wherein the excitation light source is a laser diode.

* * * * *